(12) United States Patent
Tamaya et al.

(10) Patent No.: US 9,008,146 B2
(45) Date of Patent: Apr. 14, 2015

(54) SEMICONDUCTOR LASER EXCITATION SOLID-STATE LASER

(75) Inventors: Motoaki Tamaya, Tokyo (JP); Akira Yokoyama, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/351,621

(22) PCT Filed: Nov. 16, 2011

(86) PCT No.: PCT/JP2011/076417
§ 371 (c)(1),
(2), (4) Date: Apr. 14, 2014

(87) PCT Pub. No.: WO2013/073024
PCT Pub. Date: May 23, 2013

(65) Prior Publication Data
US 2014/0233598 A1    Aug. 21, 2014

(51) Int. Cl.
*H01S 3/091*    (2006.01)
*H01S 3/02*    (2006.01)
(Continued)

(52) U.S. Cl.
CPC .............. *H01S 3/025* (2013.01); *H01S 3/0632* (2013.01); *H01S 3/0941* (2013.01); *H01S 3/0405* (2013.01);
(Continued)

(58) Field of Classification Search
CPC ..... H01S 3/0315; H01S 3/063; H01S 3/0627; H01S 3/08; H01S 5/0268
USPC .......................................................... 372/75
See application file for complete search history.

(56) References Cited

U.S. PATENT DOCUMENTS 4,892,377 A    1/1990    Randle
4,951,293 A    8/1990    Yamamoto et al.
(Continued)

FOREIGN PATENT DOCUMENTS

JP    1-140104 A    6/1989
JP    1-297632 A    11/1989
(Continued)

OTHER PUBLICATIONS

International Search Report (PCT/ISA/210) mailed on Dec. 13, 2011, by the Japanese Patent Office as the International Searching Authority for International Application No. PCT/JP2011/076417.
(Continued)

*Primary Examiner* — Tod T Van Roy
*Assistant Examiner* — Vu A Vu
(74) *Attorney, Agent, or Firm* — Buchanan Ingersoll & Rooney PC

(57) ABSTRACT

A semiconductor laser excitation solid-state laser comprises: a planar waveguide-type solid-state laser element which is disposed on a solid-state laser substrate; an LD array; and a sub-mount substrate on which joining layers of two different thicknesses are formed on the same plane; wherein the planar waveguide-type solid-state laser element is joined to the sub-mount substrate on the surface on the opposite side of a surface on which the solid-state laser substrate is mounted, via a joining layer of one of the thicknesses out of the joining layers of the two different thicknesses, and the LD array is joined to the sub-mount substrate on the surface on a light-emitting layer side, via another joining layer of the other thickness out of the joining layers of the two different thicknesses.

3 Claims, 5 Drawing Sheets

(51) Int. Cl.
*H01S 3/063* (2006.01)
*H01S 3/0941* (2006.01)
*H01S 3/04* (2006.01)
*H01S 5/022* (2006.01)
*H01S 5/024* (2006.01)
*H01S 5/40* (2006.01)

(52) U.S. Cl.
CPC ........... *H01S 5/0224* (2013.01); *H01S 5/02272* (2013.01); *H01S 5/02438* (2013.01); *H01S 5/02476* (2013.01); *H01S 5/4031* (2013.01)

(56) References Cited

U.S. PATENT DOCUMENTS

| | | | |
|---|---|---|---|
| 5,379,311 A * | 1/1995 | McFarlane et al. | 372/41 |
| 5,436,919 A | 7/1995 | Chwalek et al. | |
| 6,614,966 B2 * | 9/2003 | Kitaoka et al. | 385/52 |
| 6,690,873 B2 * | 2/2004 | Bendett et al. | 385/132 |
| 6,865,195 B2 * | 3/2005 | Jacquet | 372/20 |
| 6,970,494 B1 * | 11/2005 | Bendett et al. | 372/102 |
| 7,113,528 B2 * | 9/2006 | Miyabe et al. | 372/36 |
| 7,382,523 B2 * | 6/2008 | Gottmann et al. | 359/326 |
| 7,620,091 B2 * | 11/2009 | Heusler et al. | 372/99 |
| 7,888,146 B2 * | 2/2011 | Nakatsuka | 438/25 |
| 2005/0162731 A1 | 7/2005 | Gottmann et al. | |
| 2007/0019691 A1 * | 1/2007 | Monch et al. | 372/22 |
| 2008/0095202 A1 | 4/2008 | Yanagisawa et al. | |
| 2008/0304526 A1 * | 12/2008 | Park et al. | 372/36 |
| 2010/0309946 A1 * | 12/2010 | Nakamura et al. | 372/75 |
| 2012/0051381 A1 * | 3/2012 | Shimizu et al. | 372/50.1 |

FOREIGN PATENT DOCUMENTS

| | | |
|---|---|---|
| JP | 5-291655 A | 11/1993 |
| JP | 6-214129 A | 8/1994 |
| JP | 7-287267 A | 10/1995 |
| JP | 11-177167 A | 7/1999 |
| JP | 2007-504645 A | 3/2007 |
| JP | WO 2009/116131 A1 | 9/2009 |
| WO | WO 2006/103767 A1 | 10/2006 |

OTHER PUBLICATIONS

Japanese Office Action dated Nov. 11, 2014 issued in the corresponding Japanese Patent Application No. 2013-544035 and English language translation (6 pages).

* cited by examiner

SEMICONDUCTOR LASER EXCITATION SOLID-STATE LASER

TECHNICAL FIELD

The present invention relates to solid-state lasers that are excited by semiconductor lasers, and in particular to a module structure of a semiconductor laser excitation solid-state laser with a planar waveguide-type solid-state laser element.

BACKGROUND ART

Until now, solid-state lasers (SSL) are widely known as lasers for obtaining high output power, which use optical materials, such as $YVO_4$ and YAG, doped with rare earth elements including neodymium. In recent years, a semiconductor laser excitation solid-state laser using as its excitation light source a semiconductor laser (LD) has become the mainstream in order to achieve reduction in size and high efficiency. Furthermore, in order to obtain high output power, the semiconductor laser for excitation uses in many cases a semiconductor laser array (LD array) in which a plurality of semiconductor lasers is arranged in a direction perpendicular to the optical axis of the semiconductor laser.

The semiconductor laser excitation solid-state laser is not only used for machining applications, but also used as a light source for a display, because visible light can be obtained by halving the wavelength of the solid-state laser through second harmonic generation (SHG) using a nonlinear optical element.

The semiconductor laser excitation solid-state laser module comprises: an LD and a solid-state laser element; a heat-sink for cooling these elements; and a sub-mount for relieving linear expansion stress between the LD and solid-state laser elements and the heat-sink. Moreover, in order to couple laser light output from the LD element with the solid-state laser element and control a transverse mode when the solid-state laser oscillates, a coupling lens being interposed between the LD element and solid-state laser element is often provided. (See, for example, Patent document 1.)

On the other hand, a method has been proposed, in which the solid-state laser element has a planar waveguide structure and thereby a transverse mode in a thickness direction of the waveguide, that is, a vertical transverse mode is controlled, and a transverse mode in a width direction of the waveguide, that is, a horizontal transverse mode is controlled by a thermal lens effect produced inside the solid-state laser element, thereby eliminating the coupling lens, so as to realize a more compact semiconductor laser excitation solid-state laser module. (See, for example, Patent document 2.)

Patent document 1 is an example in which control of the transverse mode of the laser light is achieved by the coupling lens without using the waveguide structure for the solid-state laser element. Patent documents 2 and 3 are examples in which the solid-state laser element is provided with the planar waveguide structure so as to control the vertical transverse mode of the laser light, and in addition the solid-state laser element is disposed on the sub-mount provided with stripe irregularities, whereby thermal distribution is created inside the waveguide with the absorbed laser energy used as a heat source, thereby controlling the horizontal transverse mode of the laser light.

PRIOR ART DOCUMENT

Patent Document

Patent document 1: Japanese Laid-Open Patent Publication No. H11-177167
Patent document 2: International Publication No. WO2006/103767
Patent document 3: International Publication No. WO2009/116131

DISCLOSURE OF THE INVENTION

Problem to be Solved by the Invention

However, when the solid-state laser element is provided with a planar waveguide but not provided with a coupling lens as in Patent document 2, if obtaining sufficient coupling efficiency is intended, the light-emitting point of the LD element and the waveguide of the solid-state laser need high precision positioning. In Patent document 2, the LD element and solid-state laser element are constructed in advance as sub-modules in which these elements each are separately mounted on a sub-mount and a heat-sink. These sub-modules need to be joined and fixed by gluing and the like after they are positionally adjusted to each other, therefore causing a problem in that parts and assembly processes would increase in number.

The present invention has been made to solve a problem as described above, and aims at providing a semiconductor laser excitation solid-state laser module that enables the LD element and solid-state laser element to be easily positioned to each other and a high coupling efficiency to be obtained, without using the sub-module structure, in a semiconductor laser excitation solid-state laser constructed using a solid-state laser element provided with a planar waveguide.

Means for Solving the Problem

A semiconductor laser excitation solid-state laser according to the present invention comprises: a planar waveguide-type solid-state laser element in which claddings with a refraction index different from that of a plate-shaped solid-state laser medium are formed on both surfaces of the solid-state laser medium, and which is disposed on a solid-state laser substrate; an LD array in which a light-emitting layer sandwiched between cladding layers is formed on an LD substrate, and which generates laser light for exciting the solid-state laser medium from an end face thereof; and a sub-mount substrate on which joining layers of two different thicknesses are formed on the same plane; wherein the solid-state laser element is joined to the sub-mount substrate on the surface on the opposite side of a surface on which the solid-state laser substrate is mounted, via a joining layer of one of the thicknesses out of the joining layers of the two different thicknesses, and the LD array is joined to the sub-mount substrate on the surface on the light-emitting layer side, via another joining layer of the other thickness out of the joining layers of the two different thicknesses.

Advantage of the Invention

The positions of the light-emitting points of the LD array coincide with the waveguide center of the planar waveguide-type solid-state laser element when the LD array and planar waveguide-type solid-state laser element are mounted on the sub-mount substrate; therefore, a highly efficient semiconductor laser excitation solid-state laser can be provided using a simple structure, without adjusting the height positions of the LD array and planar waveguide-type solid-state laser element to each other.

EMBODIMENTS FOR CARRYING OUT THE INVENTION

Embodiment 1

Figure 1:
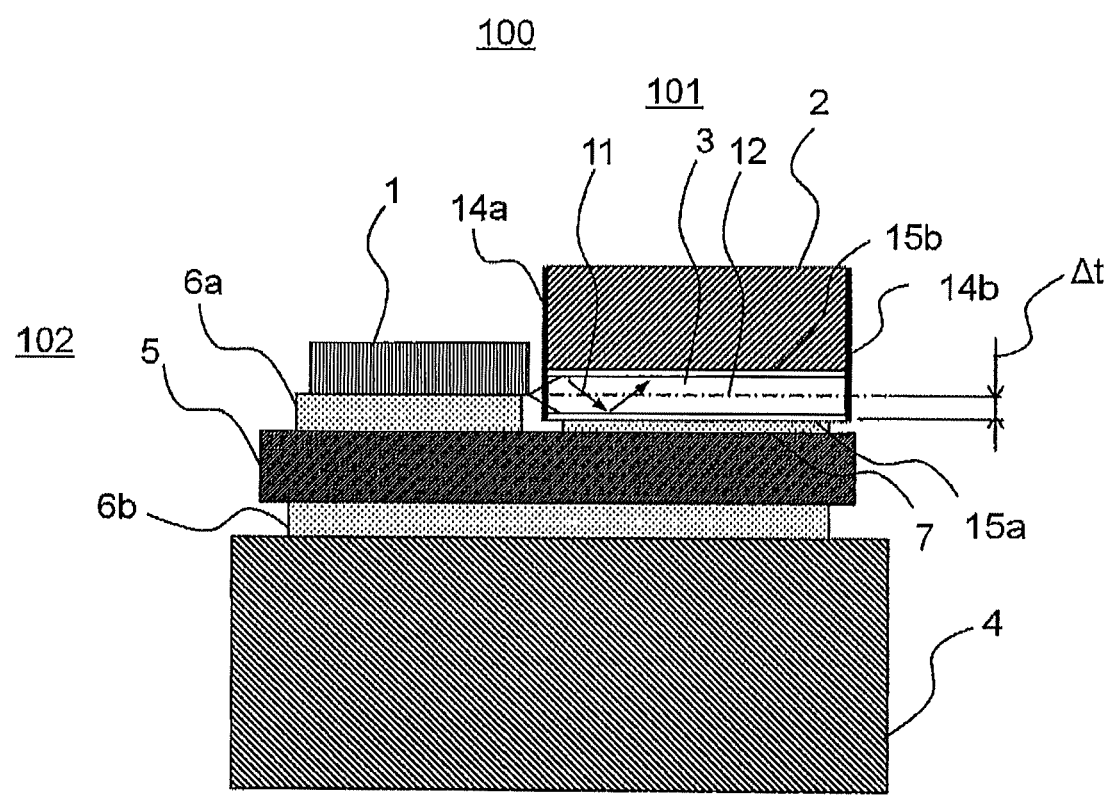
FIG. 1 is a side cross-sectional view showing a semiconductor laser excitation solid-state laser according to Embodiment 1 of the present invention.
Figure 2:
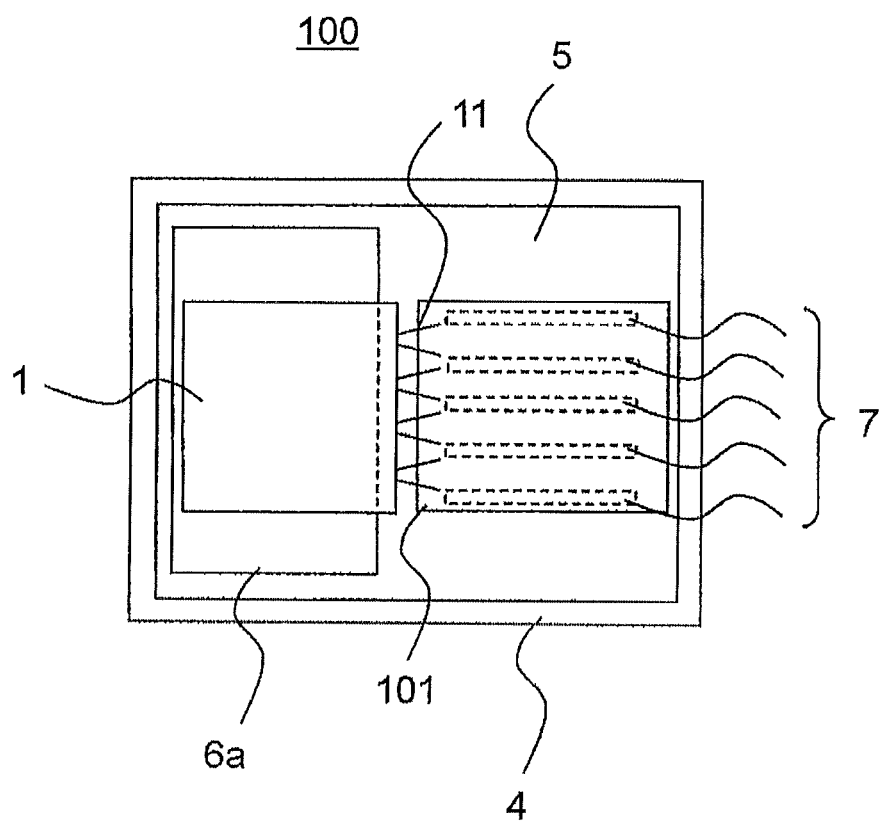
FIG. 2 is a top view showing the semiconductor laser excitation solid-state laser according to Embodiment 1 of the present invention.

FIG. 1 is a side cross-sectional view of a semiconductor laser excitation solid-state laser module 100 according to Embodiment 1; FIG. 2 is a top view thereof. The semiconductor laser excitation solid-state laser module 100 comprises: an LD array 1; a planar waveguide-type solid-state laser element 101; a sub-mount 102; and a heat-sink 4.

The heat-sink 4 is made of a metallic material, such as Cu, Fe or CuW, with high thermal conductivity. The sub-mount 102 comprises: a sub-mount substrate 5 that is made of an insulating material, such as AlN or SiC, with high thermal conductivity; joining layers 6a and 6b that are disposed on the upper and lower surfaces of this sub-mount substrate 5, respectively, and made of a metallic material, such as Cu, Ni or Au, with high thermal conductivity as well as high electrical conductivity; and a stripe joining layer 7 that is similarly made of a metallic material, such as Cu, Ni or Au, with high thermal conductivity. This sub-mount 102 is mounted and fixed on the heat-sink 4 by a method such as soldering. The LD array 1 is constructed with an n-type cladding layer of a thickness of some 1 μm, a light-emitting (active) layer of a thickness of some 0.01 μm, a p-type cladding layer of a thickness of some 1 μm and an electrode of a thickness of some 2 to 3 μm formed on an LD substrate of a thickness of around 100 μm made of a material such as GaAs. This LD array 1 is provided with a plurality of light-emitting points arrayed in a width direction of an end face of a plate-shaped solid-state laser medium 3 described later, perpendicular to the optical axis of the solid-state laser. In addition, the LD array 1 is electrically and mechanically joined to the joining layer 6a of the sub-mount 102, by a method such as soldering, on the surface on the opposite side of the LD substrate, that is, on the surface on the light-emitting layer side (with so-called junction down).

The planar waveguide-type solid-state laser element 101 comprises: the plate-shaped solid-state laser medium 3 made of a material, such as YVO$_4$ or YAG, doped with rare-earth elements including neodymium; claddings 15a and 15b that are made of a material with a refraction index different from that of the solid-state laser medium 3 and disposed on both upper and lower surfaces of the plate-shaped solid-state laser medium 3, respectively; and a solid-state laser substrate 2 that holds the solid-state laser medium 3 and claddings 15a and 15b. The solid-state laser medium 3 on both upper and lower surfaces of which are disposed the claddings 15a and 15b forms the planar waveguide. On the end face of the planar waveguide-type solid-state laser element 101 on the LD side is disposed a reflective coating 14a that passes the wavelength of excitation laser light from the LD and reflects the wavelength of solid-state laser light that is emitted by stimulated emission from the solid-state laser medium 3, and on the end face on the output side thereof is disposed a reflective coating 14b that partially reflects the solid-state laser light. The planar waveguide-type solid-state laser element 101 is mechanically joined, by a method such as soldering, to the stripe joining layer 7 of the sub-mount 102 with the solid-state laser medium 3 facing downward.

Additionally, a thickness difference of Δt is provided between the two joining layers of the sub-mount 102: the joining layer 6a on which the LD array 1 is mounted; and the stripe joining layer 7 on which the planar waveguide-type solid-state laser element 101 is mounted. Since the LD array 1 is disposed with the junction down here, the height of the light-emitting layer of the LD array 1 from its bottom surface is given by the following equation:

[Height of light-emitting layer $h_{LD}$]=[electrode thickness $h_{metal}$]+[p-type cladding thickness $h_{pcrad}$]

Moreover, since the planar waveguide-type solid-state laser element 101 is disposed with the solid-state laser medium 3 facing downward, the height of the waveguide center 12 from the bottom surface of the planar waveguide-type solid-state laser element 101 is expressed as follows:

[Height of waveguide center $h_{center}$]=[thickness of solid-state laser medium $h_{core}$]/2+[cladding thickness $h_{crad}$].

The thickness difference Δt between the joining layer 6a and stripe joining layer 7 is made as given by the following equation:

[Δt]=[height of waveguide center $h_{center}$]−[height of light-emitting layer $h_{LD}$].

As described above, since the electrode thickness $h_{metal}$ is 2 to 3 μm, the p-type cladding layer thickness $h_{pcrad}$ some 1 μm, and the thickness of the solid-state laser medium 3 typically some 40 μm, Δt becomes some 20 μm. When each layer is formed by plating, a difference in thickness such as this can be provided between the joining layer 6a and stripe joining layer 7 by adjusting the plating time. Furthermore, the LD array 1 and planar waveguide-type solid-state laser element 101 are joined by soldering and the like to the joining layer 6a and stripe joining layer 7 of the sub-mount 102, respectively; however, the thickness of the solder layers is a few μm, so the thicknesses of each solder layer can easily be made nearly the same.

The operation will be explained next using FIG. 1 and FIG. 2. When the LD array 1 is made to oscillate and emit light, excitation laser light 11 propagates with a certain diverging angle in a vertical and a horizontal direction and is incident on the solid-state laser medium 3 of the planar waveguide-type solid-state laser element 101. Light components of the incident excitation laser light 11 that cause total reflections at the claddings 15a and 15b control the thickness-direction mode of the waveguide, and are absorbed in the solid-state laser medium 3, while coupling and propagating inside the planar waveguide. Moreover, part of the absorbed energy is converted into heat. The heat generated inside the solid-state laser medium 3 is dissipated through the stripe joining layer 7. Here, the stripe joining layer 7 includes a plurality of stripe joining layers extending in an optical axis direction of the solid-state laser as shown in FIG. 2. Cooling paths are short at portions where the cladding 15a on the surface of the solid-state laser medium 3 contacts the stripe joining layer 7, whereas the paths are long at portions where it doesn't. Therefore, there rises temperature distribution in the solid-state laser medium 3, in which temperatures at central portions corresponding to the portions that do not contact the stripe joining layer 7 become relatively high. This temperature distribution causes distribution of the refraction index of the material, that is, the so-called thermal lens effect, and thereby the same effect as providing focal lenses at each portion of the solid-state laser medium contacting the stripe joining layer 7 can be produced.

Furthermore, the solid-state laser medium 3 causes stimulated emission as excited by the absorbed excitation light; using the reflective coatings 14a and 14b as a resonator, the vertical transverse mode is controlled by the waveguide and the horizontal transverse mode is controlled by the thermal lens effect, thereby laser oscillation taking place.

If the positions of the light-emitting points of the LD array 1 are deviated from the vertical position of the solid-state laser medium 3 here, the laser light is not sufficiently coupled with the waveguide, thereby leading to deterioration of efficiency. However, in the semiconductor laser excitation solid-state laser module according to this Embodiment 1, the light-emitting points of the LD array 1 are arranged to coincide with the waveguide center in advance by making the difference in thickness between the stripe joining layer 7 and joining layer 6a Δt, so that the excitation light can be highly efficiently coupled with the waveguide without adjusting the height positions of the light-emitting points of the LD array 1 and that of the planar waveguide-type solid-state laser element 101.

Next, a process will be explained in which the sub-mount substrate 5 is mechanically fixed to the heat-sink 4 by soldering and the LD array 1 and planar waveguide-type solid-state laser element 101 to the sub-mount 102. In this case, heating and cooling processes for melting solder become necessary.

A case using AuSn as the solder will be described. In the heating process for melting the AuSn solder, the heat-sink 4, the sub-mount 102, the LD array 1 and the planar waveguide-type solid-state laser element 101 thermally expand as their temperatures rise up, depending on the linear expansion coefficient of each of the materials. In addition, in the cooling process for solidifying the AuSn solder, thermal contraction takes place in each of the components as their temperatures drop. The LD array 1 and planar waveguide-type solid-state laser element 101 are mechanically joined to the sub-mount 102 when their temperatures reach 280° C., which is the melting point of the AuSn solder; however, in the cooling process from the melting point to room temperature, if there is any difference between the thermal contraction of the sub-mount 102 and that of the LD array 1 and planar waveguide-type solid-state laser element 101, stress is imposed on the interior of the LD array 1 and that of the planar waveguide-type solid-state laser element 101. Furthermore, the greater the difference in the foregoing thermal contraction, the greater the stress imposed thereon, which would shorten the driving lifetime of the planar waveguide-type solid-state laser.

When a material for the LD array 1 is GaAs and materials for the solid-state laser medium 3 and solid-state laser substrate 2 are $YVO_4$, their respective linear expansion coefficients are $6.6 \times 10^{-6}$ mm/mm and $1.7 \times 10^{-6}$ mm/mm. While on the other hand, when a material for the sub-mount substrate 5 is SiC, the linear expansion coefficient of SiC is $3.7 \times 10^{-6}$ mm/mm, which is close enough to those of the materials for the LD array 1, solid-state laser medium 3 and solid-state laser substrate 2; therefore, stress caused in the LD array 1 and planar waveguide-type solid-state laser element 101 can be made small enough, when the LD array 1 and planar waveguide-type solid-state laser element 101 are soldered and even when the temperature of the semiconductor laser excitation solid-state laser module 100 rises up in its driving operation. Moreover, AlN and Si, which are low-expansion insulation materials other than that, may be used for the sub-mount substrate material.

Figure 3:
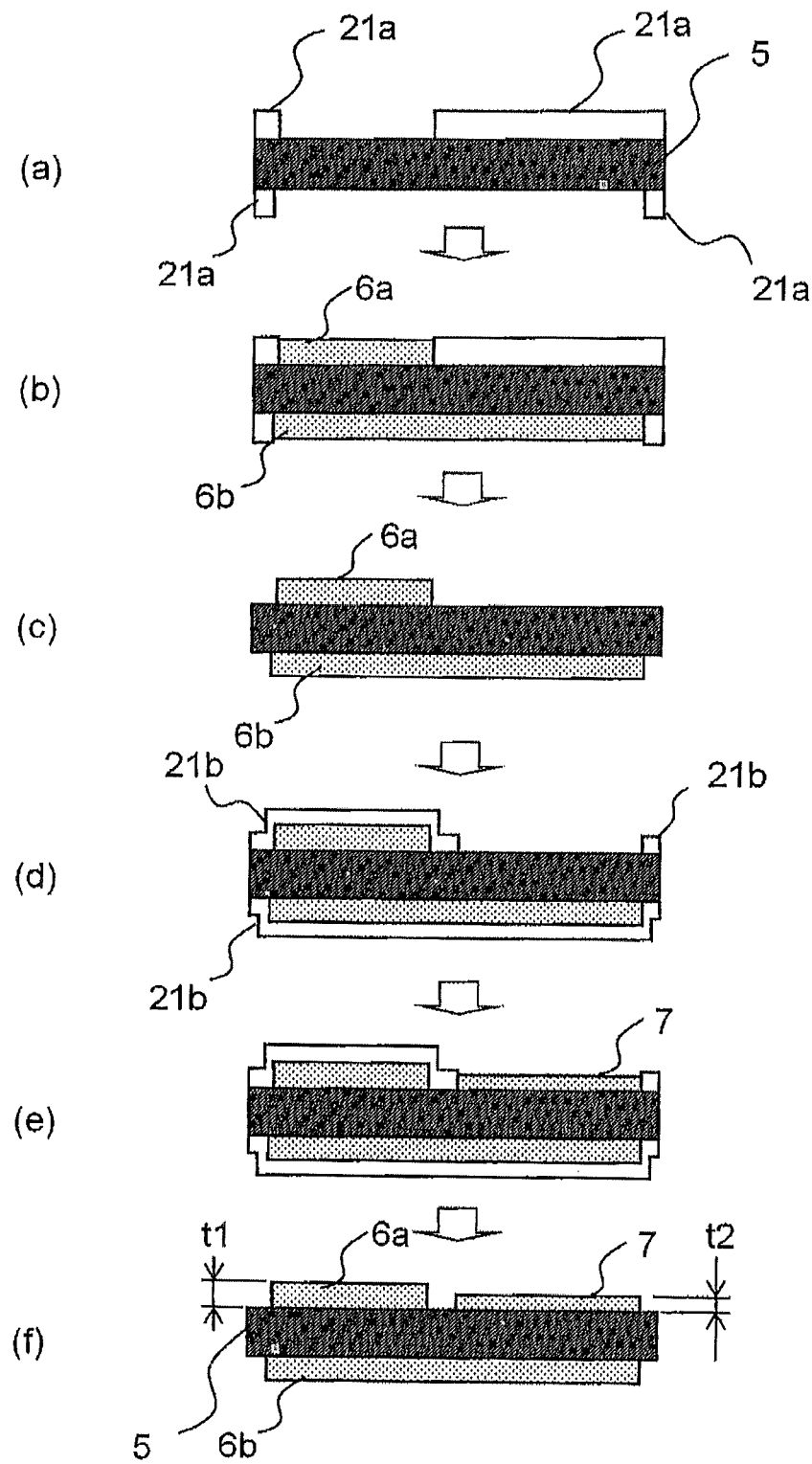
FIG. 3 is a view showing an example of a method of forming joining layers on a sub-mount substrate according to Embodiment 1 of the present invention.

Next, as an example of a method of forming the joining layers 6a, 6b and 7 on the sub-mount substrate 5, a method of forming each layer by metal plating will be explained using FIG. 3. First, a resist layer 21a corresponding to the joining layers 6a and 6b is formed on the sub-mount substrate 5 (see FIG. 3 (a)); plating of a thickness of t1 is performed by adjusting the plating time (see FIG. 3 (b)). Secondly, the resist layer 21a is removed (see FIG. 3 (c)), and then a resist layer 21b corresponding to the stripe joining layer 7 is formed anew (see FIG. 3 (d)). At this moment, the resist layer 21b is formed so as to also cover the already-formed joining layers 6a and 6b. Thirdly, plating of a thickness of t2 is performed by adjusting the plating time (see FIG. 3 (e)), and following that the resist layer 21b is removed (see FIG. 3 (f)), whereby the joining layers 6a and 6b of the thickness t1 and stripe joining layer 7 of the thickness t2 are formed. By making t1−t2=Δt here, the light-emitting part of the LD array 1 and the incident center of the solid-state laser medium 3 can be aligned with each other, so that a highly efficient semiconductor laser excitation solid-state laser can be provided without adjusting their positions. Additionally, even if an error of this thickness difference Δt is some ±10 μm when the thickness of the solid-state laser medium is, for example, 40 μm, excitation efficiency will not be deteriorated so much. It is easy to adjust the plating thickness within an error such as this. Additionally, an allowable error differs depending on, for example, the thickness of the solid-state laser medium 3, the diverging angle of laser light the LD array 1 generates, the distance between the end face of the solid-state laser medium 3 and the light-emitting points of the LD array 1, and so forth; however, it is decided to be a value at which the excitation efficiency is reduced by 10%, for example, or more preferably by 5%, from the maximum efficiency. That is to say, taking into consideration deterioration rates of efficiency in individual planar waveguide-type semiconductor laser excitation solid-state lasers, a predetermined error is decided for each.

As described above, the difference in thickness between the joining layers of two different thicknesses has only to be set to become the dimensions of the difference in height between the planar waveguide center from the plane on which the planar waveguide-type solid-state laser element is joined to the joining layer and the light-emitting layer of the LD array from the outer surface thereof on the light-emitting layer side and an error that is not greater than a predetermined error.

Additionally, the joining layers 6a and 6b and stripe joining layer 7 each may be a plating layer with a laminated structure in which plating layers of a plurality of different metals are formed in sequence. Furthermore, these joining layers are not plating layers but the joining layer 6a and stripe joining layer 7 may be formed by joining to the sub-mount substrate 5 metal sheets whose thicknesses are different by Δt from each other.

As described above, the semiconductor laser excitation solid-state laser according to Embodiment 1 of the present invention is constructed in such a way that the LD array 1 and planar waveguide-type solid-state laser element 101 are joined to the common sub-mount substrate 5, via the joining layer 6a and stripe joining layer 7, respectively, and the thickness difference Δt is provided between the joining layer 6a and stripe joining layer 7; therefore, the light-emitting part of the LD array 1 and the incident center of the solid-state laser medium 3 can be aligned with each other without adjusting their positions, so that a highly efficient semiconductor laser excitation solid-state laser can be provided.

Embodiment 2

Figure 4:
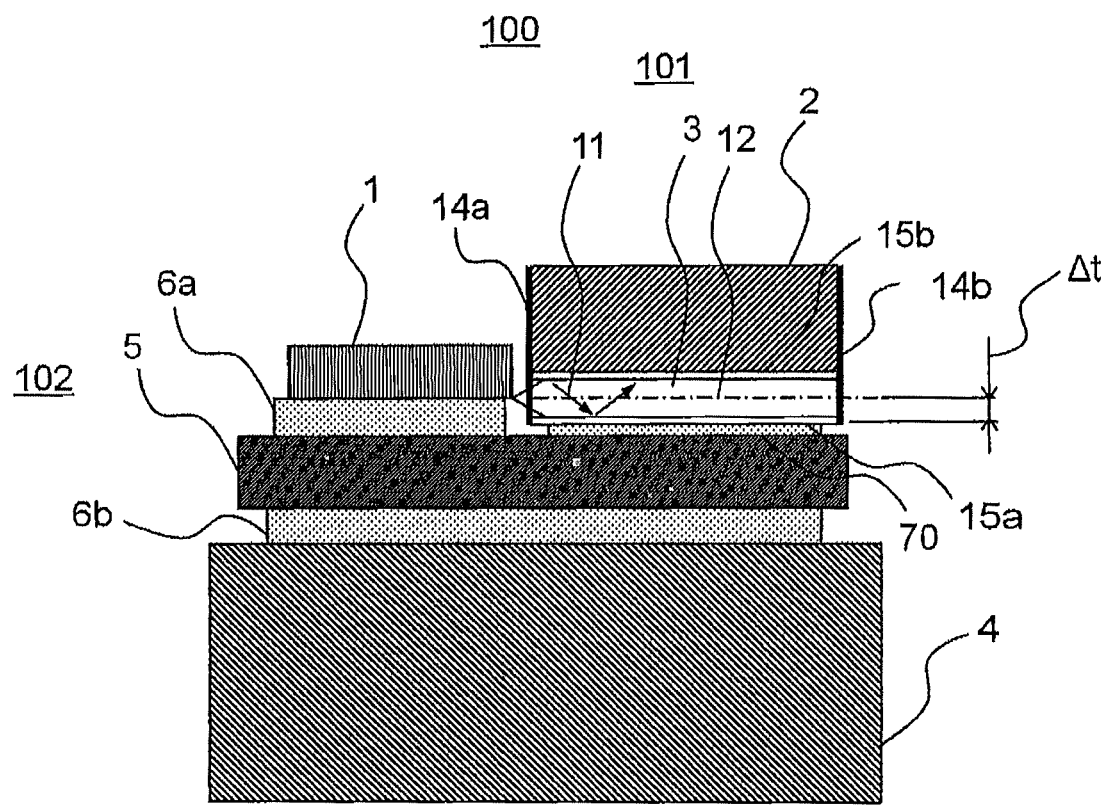
FIG. 4 is a side cross-sectional view showing a semiconductor laser excitation solid-state laser according to Embodiment 2 of the present invention.
Figure 5:
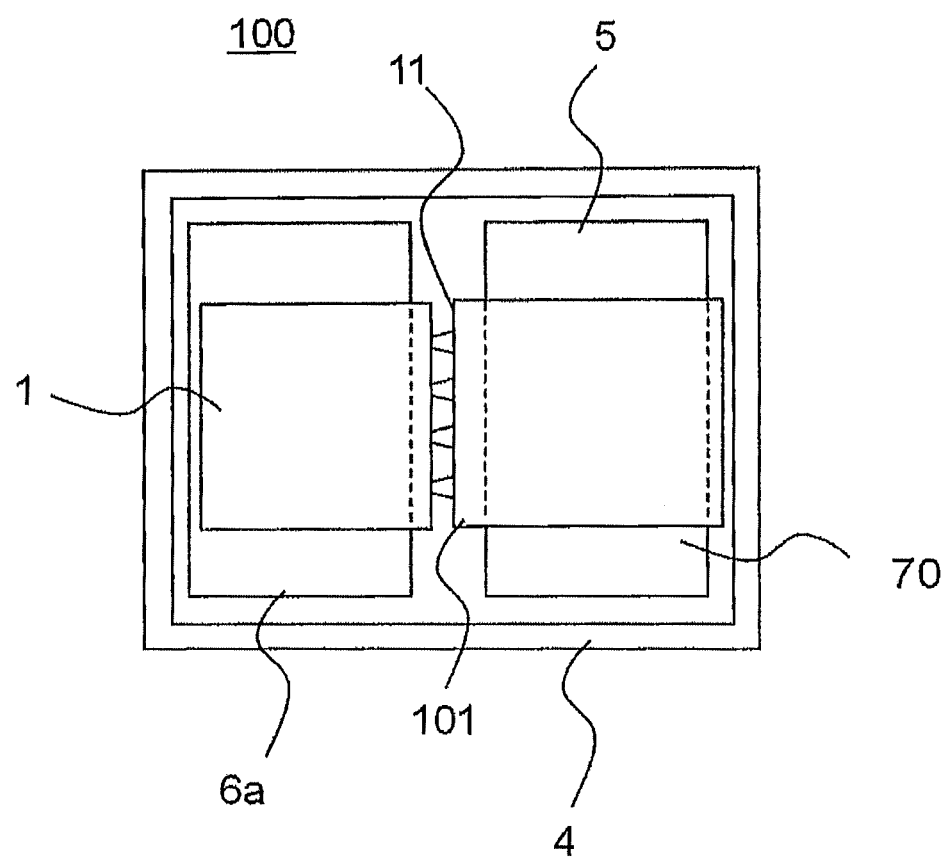
FIG. 5 is a top view showing the semiconductor laser excitation solid-state laser according to Embodiment 2 of the present invention.

FIG. 4 is a side cross-sectional view of a semiconductor laser excitation solid-state laser module 100 according to Embodiment 2; FIG. 5 is a top view thereof. In FIG. 4 and FIG. 5, the same reference numerals as those in FIG. 1 and FIG. 2 represent the same or corresponding parts. In this Embodiment 2, the joining layer for joining the planar waveguide-type solid-state laser element 101 to the sub-mount 5 is made to be an unbroken joining layer 70 similar to the joining layer 6a, as shown in the top view of FIG. 5.

A case of a semiconductor laser excitation solid-state laser system has been explained in Embodiment 1, in which the horizontal transverse mode is controlled with the planar waveguide-type solid-state laser element mounted on the stripe joining layer 7. However, the same effect as that in Embodiment 1 can be produced even if this invention is applied to other semiconductor laser excitation solid-state laser systems, such as one in which the excitation light from the LD array is coupled with the planar waveguide-type solid-state laser element 101 through, for example, a micro lens array so as to control the horizontal transverse mode.

That is to say, the same as Embodiment 1, the difference in thickness between the joining layer 70 and joining layer 6a is made Δt in this Embodiment 2 as well, whereby the light-emitting part of the LD array 1 and the incident center of the solid-state laser medium 3 are aligned with each other without adjusting their positions, so that a highly efficient semiconductor laser excitation solid-state laser can be provided,

DESCRIPTION OF THE REFERENCE NUMERALS

1: LD array
2: solid-state laser substrate
3: solid-state laser medium
4: heat-sink
5: sub-mount substrate
6a, 6b, 70: joining layer
7: stripe joining layer
15a, 15b: cladding
101: planar waveguide-type solid-state laser element
102: sub-mount

The invention claimed is:

1. A semiconductor laser excitation solid-state laser, comprising:
   a planar waveguide-type solid-state laser element in which claddings with a refraction index different from that of a plate-shaped solid-state laser medium are formed on both surfaces of the solid-state laser medium, and which is disposed on a solid-state laser substrate;
   an LD array in which a light-emitting layer sandwiched between cladding layers is formed on an LD substrate, and which generates laser light for exciting the solid-state laser medium from an end face thereof; and
   a sub-mount substrate on which joining layers of two different thicknesses are formed by metal plating on the same plane; wherein
   the planar waveguide-type solid-state laser element is joined to the sub-mount substrate on a surface on the opposite side of a surface on which the solid-state laser substrate is mounted such that the planar waveguide-type solid-state laser element is sandwiched between the sold-state laser substrate and the sub-mount substrate, via a joining layer of one of the thicknesses out of the joining layers of the two different thicknesses, and the LD array is joined to the sub-mount substrate on a surface on the light-emitting layer side, via another joining layer of the other thickness out of the joining layers of the two different thicknesses.

2. A semiconductor laser excitation solid-state laser according to claim 1, wherein the planar wavequide-type solid-state laser element is one element and is joined to the sub-mount substrate via the joining layer of the one of the thicknesses which is formed of a plurality of stripe joining layers extending in an optical axis direction of the solid-state laser.

3. A semiconductor laser excitation solid-state laser according to any claim 1, wherein difference in thickness between the joining layers of the two different thicknesses is set to be the dimensions of difference in height between a planar waveguide center of the planar waveguide-type solid-state laser element from a plane on which the planar waveguide-type solid-state laser element is joined to the joining layer and the light-emitting layer of the LD array from an outer surface thereof on the light-emitting layer side, and an error of difference in thicknesses of the joining layers of the two different thicknesses is not greater than a predetermined error.

* * * * *